United States Patent
Lu et al.

(10) Patent No.: US 9,165,570 B2
(45) Date of Patent: Oct. 20, 2015

(54) DATA READER WITH MAGNETIC SEED LAMINATION

(71) Applicant: Seagate Technology LLC, Cupertino, CA (US)

(72) Inventors: Zhengqi Lu, Londonderry (GB); Ann Lynch, Springtown (GB); Daniel Hassett, Newtowncunningham (IE); Jiansheng Xu, Londonderry (GB); Jae-Young Yi, Prior Lake, MN (US); Liwen Tan, Eden Prairie, MN (US); Eric W. Singleton, Maple Plain, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/576,982

(22) Filed: Dec. 19, 2014

(65) Prior Publication Data
US 2015/0103438 A1    Apr. 16, 2015

Related U.S. Application Data

(63) Continuation of application No. 13/761,216, filed on Feb. 7, 2013, now abandoned.

(51) Int. Cl.
*G11B 5/39* (2006.01)
*G11B 5/23* (2006.01)
*G01R 33/09* (2006.01)

(52) U.S. Cl.
CPC ............... *G11B 5/23* (2013.01); *G01R 33/093* (2013.01); *G11B 5/3912* (2013.01); *G11B 5/3929* (2013.01)

(58) Field of Classification Search
CPC ............ G11B 5/3932; G11B 2005/3996; G11B 5/3912; G11B 5/313; G11B 5/3906; G11B 5/732; G11B 5/3929; G11B 5/23; G01R 33/093
USPC .................................. 360/319, 324–324.2
See application file for complete search history.

(56) References Cited

U.S. PATENT DOCUMENTS

| | | |
|---|---|---|
| 7,192,663 B2 * | 3/2007 | Chang et al. ............ 428/827 |
| 7,384,699 B2 | 6/2008 | Nolan et al. |
| 7,397,640 B2 | 7/2008 | Pinarbasi |
| 7,428,129 B2 | 9/2008 | Pinarbasi |
| 7,433,163 B2 | 10/2008 | Freitag et al. |
| 7,773,348 B2 | 8/2010 | Freitag et al. |
| 8,009,391 B2 | 8/2011 | Tanaka et al. |
| 8,164,862 B2 | 4/2012 | Zhang et al. |
| 8,168,310 B2 | 5/2012 | Bian et al. |
| 8,169,753 B2 | 5/2012 | Lin |
| 8,422,176 B1 | 4/2013 | Leng et al. |
| 8,493,693 B1 | 7/2013 | Zheng et al. |
| 8,537,502 B1 | 9/2013 | Park et al. |

(Continued)

FOREIGN PATENT DOCUMENTS

WO    2012/082998 A1    6/2012

*Primary Examiner* — Will J Klimowicz
(74) *Attorney, Agent, or Firm* — Hall Estill Attorneys at Law

(57) ABSTRACT

A magnetic element capable of reading data may generally be configured at least with a magnetic seed lamination disposed between a data reader stack and a magnetic shield. The magnetic seed lamination may be constructed at least with one magnetic layer coupled to the bottom shield and at least one non-magnetic layer decoupling the data reader stack from the at least one magnetic layer.

20 Claims, 4 Drawing Sheets

(56) References Cited

U.S. PATENT DOCUMENTS

| | | |
|---|---|---|
| 8,547,667 B1 | 10/2013 | Roy et al. |
| 8,582,249 B2 | 11/2013 | Sapozhnikov et al. |
| 8,582,253 B1 | 11/2013 | Zheng et al. |
| 2006/0012925 A1 | 1/2006 | Pinarbasi |
| 2009/0174968 A1 | 7/2009 | Singleton et al. |
| 2009/0251829 A1 | 10/2009 | Zhang et al. |
| 2011/0268991 A1 | 11/2011 | Benakli et al. |
| 2012/0229935 A1 | 9/2012 | Song et al. |
| 2012/0276415 A1 | 11/2012 | Sapozhnikov et al. |
| 2013/0065084 A1 | 3/2013 | Dimitrov et al. |
| 2013/0288076 A1 | 10/2013 | Singleton et al. |
| 2013/0293225 A1 | 11/2013 | Singleton et al. |

* cited by examiner

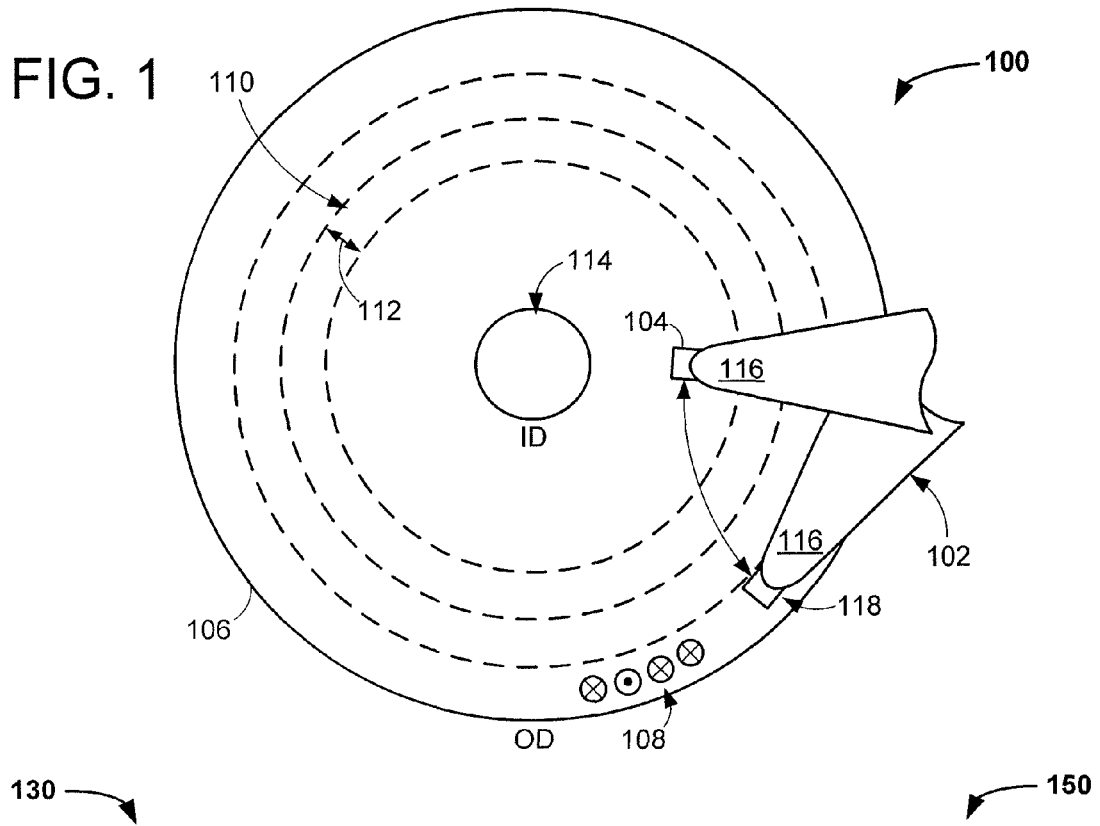
FIG. 1
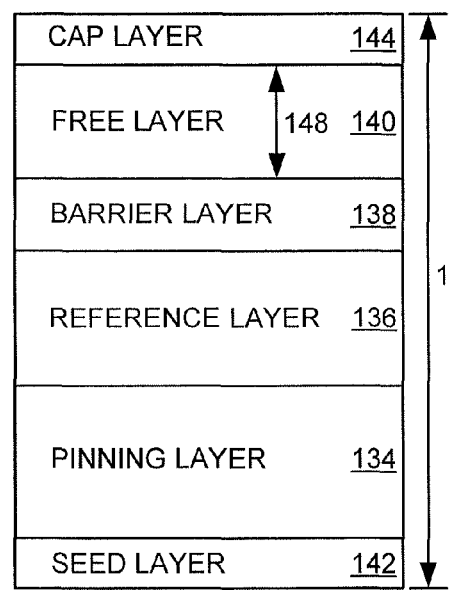
FIG. 2A
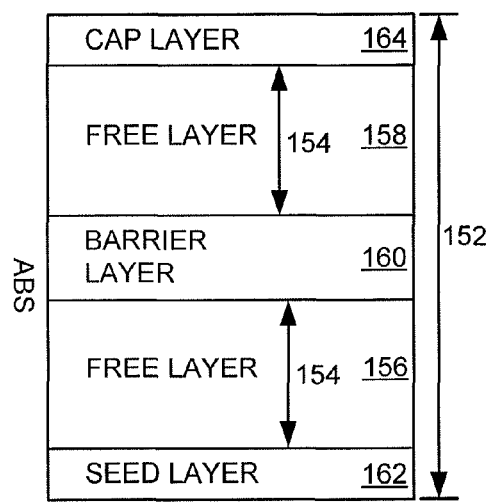
FIG. 2B
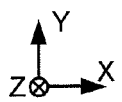

DATA READER WITH MAGNETIC SEED LAMINATION

RELATED APPLICATION

This application is a continuation of copending U.S. patent application Ser. No. 13/761,216 filed on Feb. 7, 2013.

SUMMARY

Various embodiments are generally directed to a magnetic element capable of reading data bits in various data storage environments.

In accordance with various embodiments, a magnetic element may be configured at least with a magnetic seed lamination disposed between a data reader stack and a magnetic shield. The magnetic seed lamination may be constructed at least with one magnetic layer coupled to the bottom shield and at least one non-magnetic layer decoupling the data reader stack from the at least one magnetic layer.

BRIEF DESCRIPTION OF THE DRAWINGS

FIG. 1 is a block representation of an example portion of a data storage device configured and operated in accordance with some embodiments.

FIGS. 2A and 2B respectively show portions of example magnetic elements capable of being used in the data storage element of FIG. 1.

DETAILED DESCRIPTION

Figure 3:
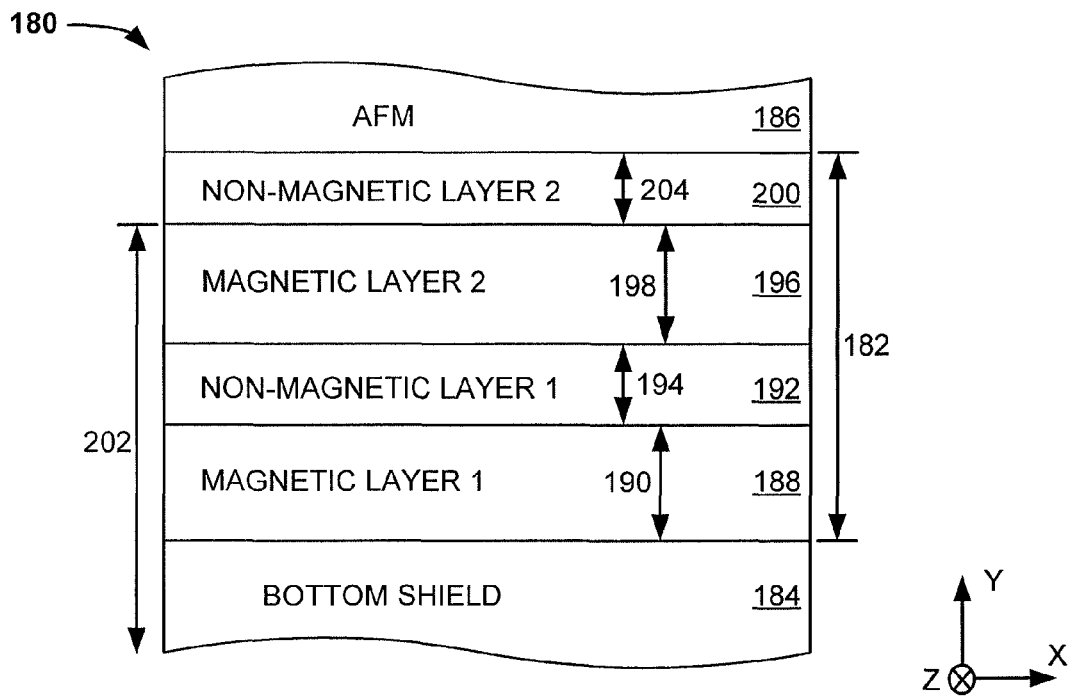
FIG. 3 displays a portion of an example magnetic element constructed in accordance with various embodiments.

The continued trend of modern electronics of reduced physical size and increased data storage capacity has stressed the scalability of various data transducing components to the point where data access speeds are weighed against data access reliability. An increase in data bit density can correspond to smaller data access components that may be susceptible to magnetization variations in response to stray magnetic fields. With the physical thickness of different portions of a magnetic element being reduced to near operational limits, scaling the size of the magnetic element to access more densely populated data bits can be difficult. Thus, industry is increasingly concerned with the minimization of magnetic elements while retaining operational speed and accuracy.

With such issues in mind, various embodiments may construct a magnetic element with at least a magnetic seed lamination disposed between a data reader stack and a magnetic shield, where the magnetic seed lamination has at least one magnetic layer coupled to the bottom shield and at least one non-magnetic layer decoupling the data reader stack from the at least one magnetic layer. By tuning the magnetic seed lamination for material, number of layers, and layer thicknesses, operation of the magnetic element can be stabilized while providing a reduced magnetic extent that can quickly and reliably access individual data bits in a high data bit density data storage environment.

Construction and operation of a magnetic element with a tuned seed lamination may be implemented into an unlimited variety of data storage environments, but FIG. 1 displays a top view block representation of an example data storage device 100 environment in which a tuned magnetic element can operate in accordance with various embodiments. While not limiting or required, the data storage device 100 has an actuating assembly 102 that is capable of positioning a transducing head 104 over a variety of locations on a magnetic storage media 106 where stored data bits 108 are located on predetermined data tracks 110. Each data track 110 may be configured with a width 112 that corresponds with an areal density that determines the storage capacity of the media 106.

Movement of the storage media 106 can be facilitated through attachment to one or more spindle motors 114 that rotate during use to produce an air bearing surface (ABS) on which a slider portion 116 of the actuating assembly 102 flies to position a head gimbal assembly (HGA) 118, which includes the transducing head 104, over a predetermined portion of the media 106. The transducing head 104 can be configured with one or more transducing elements, such as a magnetic writer, magnetically responsive reader, and magnetic shields, which operate to program and read data from the selected data tracks 110 of the storage media 106, respectively. In this way, controlled motion of the actuating assembly 102 correspond with alignment of the transducers with the data tracks 110 defined on the storage media surfaces to write, read, and rewrite data.

As data bits 108 become more densely positioned in data tracks 110 with smaller radial widths 112, the head 104 has to be responsive to smaller magnetic flux signatures with reliable accuracy, which can be problematic when the physical size of the head 104 components are reduced. Various magnetically responsive stack configurations may be utilized to read the smaller magnetic flux signatures. It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits. For example, but not in any way limiting, a magnetic stack may be a data reader that can differentiate between a plurality of data bits.

FIGS. 2A and 2B respectively show magnetic stacks 130 and 150 each capable of being used in the data storage device 100 of FIG. 1. As shown in FIG. 2A, an abutted junction magnetic stack 130 is constructed with a fixed magnetization pinning layer 134 contacting a fixed magnetization reference layer 136 opposite a non-magnetic barrier layer 138 from a magnetically free layer 140. The non-magnetic barrier layer 138 may, alternatively, be constructed as spacer layer of non-magnetic material, such as Cu or Ag. As the free layer 140 responds to an external data bit while the reference layer 136 maintains a fixed magnetization due to the exchange coupling with the pinning layer 134, an external data bit can be read as a logic state. Through various tuned configurations, seed 142 and cap 144 layers can be positioned on a single, or opposite sides of the stack 130 to provide predetermined grain growth and magnetic properties, such as anisotropy, in the pinning layer 134.

Construction of the abutted junction magnetic stack 130 can have a shield-to-shield spacing 146 and free layer thickness 148 that determines the magnetic extent of the stack 130 and the possible data track resolution. However, the inclusion of the reference 136 and pinning 134 layers can correspond to a smaller free layer thickness 148, increased shield-to-shield spacing 146, and reduced magnetoresistive ratio between the free 140 and reference 136 layers. In contrast, the trilayer stack 150 of FIG. 2B may be used to read data bits with a reduced shield-to-shield spacing 152 and greater free layer thickness 154 compared to the abutted junction stack 130.

In operation, the trilayer stack 150 has first 156 and second 158 magnetically free layers that are separated by a barrier layer 160 and set to default magnetizations by biasing structures external to the trilayer stack 150. The relocation of any fixed magnetization structures from the stack 150 to elsewhere allow for the reduced physical size 152 compared to the fixed magnetization having abutted junction stack 130. However, the lack of any fixed magnetization in the trilayer stack 150 can be difficult to bias properly to read data at an elevated speed. Thusly, refinement of the abutted junction stack 130 to reduce shield-to-shield spacing 146 has been a recent focus.

While various aspects of the abutted junction stack 130, such as the barrier layer 138, may be reduced in size while maintaining predetermined operating conditions, the seed layer 142 is tuned in some embodiments to increase stack 130 stability and allow thinner ferromagnetic thicknesses 148 to be utilized. A seed layer 142 can be used to promote the texture and grain growth of layers, such as pinning layer 134, subsequently grown atop the seed layer 142. The seed layer 142 is not limited to a particular material or purpose, but various embodiments tune the seed layer 142 at least for atomic structure to provide a predetermined crystallographic direction in the adjacently deposited layers.

A non-limiting configuration of the seed layer 142 can be as a single layer of magnetic or non-magnetic material, such as Ta or NiFe. A magnetic construction can couple the seed layer 142 to an underlying magnetic shield to effectively make the thickness of the seed layer 142 disappear for the shield-to-shield spacing 146. In yet, magnetization differences that may be a result of annealing processes can correspond with magnetic stability issues between the pinning layer 134, bottom shield, and seed layer 142. Such magnetic stability issues can result in inadvertent magnetic domain movement for the reference 136 and free 140 layers of the magnetic stack 130.

FIG. 3 displays a portion of an example magnetic element 180 constructed with a tuned seed lamination 182 that can mitigate inadvertent magnetic domain movement by being coupled to a bottom shield and decoupled from an antiferromagnetic (AFM) pinning layer 186. The seed lamination 182 has a first magnetic layer 188 with a first thickness 190 directly contacting the bottom shield 184. A first non-magnetic layer 192 with a second thickness 194 is positioned between the first magnetic layer 188 and a second magnetic layer 196. Each magnetic layer 188 and 196 can be formed of similar or dissimilar materials, such as NiFe, NiFeCr, NiFeMo, NiFeW, CoFe, CoNiFe, CoFeB, or bilayers like NiFe/CoFe while the first non-magnetic layer 192 is constructed of a wide variety of materials, such as Cu, Ag, Au, Pt, Pd, Ru, Ta, Cr, Mo, and alloys thereof.

The ability to tune the first and second magnetic layers 188 and 196 for material as well as first and third thicknesses 190 and 198 respectively controls coupling strength with the bottom shield 184 while providing predetermined crystallographic characteristics for the second non-magnetic layer 200 and the AFM deposited on top. With the direct physical contact of the first magnetic layer 188 and the bottom shield 184, direct coupling with the bottom shield 184 allows the coupled portion 202 of the seed lamination 182 and the bottom shield 184 to effectively disappear from the shield-to-shield spacing of the magnetic element 180 and reduce the magnetic extent and data track resolution of the element's magnetic stack.

The coupling of the magnetic 188 and 196 and non-magnetic 192 layers extends the functional extent of the bottom shield 184 as each magnetic layer 188 and 196 has a magnetization strength and direction in response to the magnetization of the bottom shield 184. That is, in response to external magnetic fields, the magnetization of the bottom shield 184 consequently induces magnetizations in the magnetic layers 188 and 196 through magnetic coupling, such as antiferromagnetic coupling, provided by the first non-magnetic layer 192, which acts to dissipate stray magnetic fields and protect the magnetic integrity of the adjacent magnetic stack. However, if the seed lamination 182 was also coupled to the AFM 186, the magnetization changes of the bottom shield 184 could disrupt the magnetically sensitive portions of the magnetic stack and jeopardize the magnetoresistive accuracy of the magnetic element 180.

To prevent the coupled magnetic layers 188 and 196 from imposing on the magnetization of the magnetic stack, the second non-magnetic layer 200 is formed with a predetermined fourth thickness 204 and material that may be similar or dissimilar from the other seed lamination thicknesses 190, 194, and 198 and layers 188, 192, and 196 to decouple the AFM 186 from the coupled portion 202. Such decoupling of the AFM 186 can optimize the exchange bias field between the AFM 186 and a fixed magnetization reference layer, such as layer 136 of FIG. 2A. Various embodiments tune the second non-magnetic layer 200 with a substantially smooth surface texture and a material that acts as a barrier to block material, such as Mn, from diffusing into the magnetic layers 188 and 196.

The placement of multiple magnetic 188 and 196 and non-magnetic 192 and 200 layers can further allow for precise tuning of the magnetic profile of the seed lamination 182 and consequently the connected magnetic stack. For example, tuning the magnetic layers 188 and 196 to similar or dissimilar coupling strengths, uniaxial anisotropies, and magnetic moments can alter the manner in which magnetic fields are absorbed in the seed lamination 182. Tuning of the seed lamination 182 is not limited to the number and types of layers presented in FIG. 3 as various magnetic and non-magnetic layers can be configured in different ways to decrease the shield-to-shield spacing of the magnetic element 180 by coupling to the bottom shield 184 while decoupling the seed lamination 182 from the magnetic stack.

Figure 4:
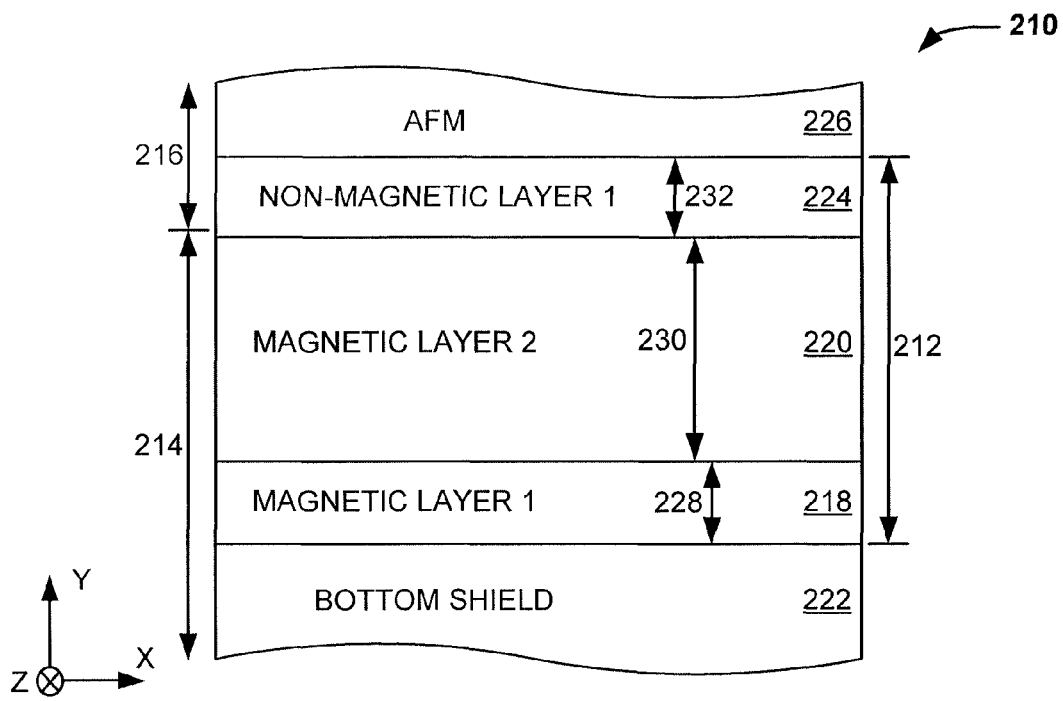
FIG. 4 shows a portion of an example magnetic element constructed in accordance with some embodiments.

FIG. 4 illustrates a portion of an example magnetic element 210 with a seed lamination 212 tuned in accordance with some embodiments to have a coupled portion 214 and a decoupled portion 216. The coupled portion 214 is configured with first and second magnetic layers 218 and 220 coupled to a bottom shield 222 while the decoupled portion 216 has a non-magnetic layer 224 decoupling the AFM 226 of a magnetic stack from the magnetic layers 218 and 220. The first magnetic layer 218 can be constructed with a first thickness 228 that is less than a second thickness 230 of the second magnetic layer 220 and a material, such as amorphous NiFe alloy, CoFeB, CoFe, CoFeNb, NiFeNb, and CoZrTa, that couples the second magnetic layer 220 to the bottom shield 222 and provides predetermined magnetization strength and direction.

The tuned thickness 230 and material, such as NiFe or alloys like NiFeW, of the second magnetic layer 220 can be exchange coupled with the bottom shield 222 to effectively make the magnetic layers 218 and 220 effectively part of the bottom shield 222, which reduces the shield-to-shield spacing of the magnetic element 210. The magnetic coupling provided by the magnetic layers 218 and 220 is complemented by the decoupling portion 216 where the non-magnetic layer 224 is tuned for thickness 232 and material, such as Ru, Pt, Hf, Ta, Zr, Nb, Au, Rd, and alloys like NiCr to provide predetermined lattice construction in the subsequently deposited AFM 226 and a predetermined physical size of the seed lamination 212 that does not inflate the pulse width at 50% of the magnetic element's peak amplitude.

Figure 5:
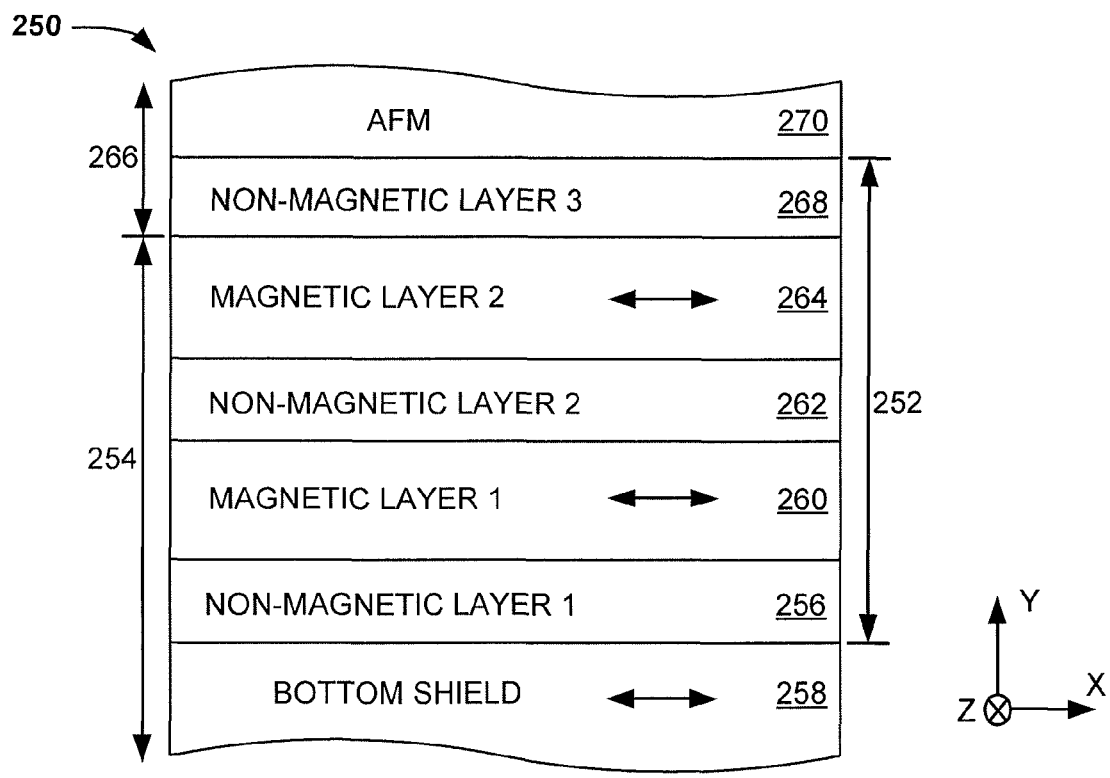
FIG. 5 illustrates a portion of an example magnetic element constructed an operated in accordance with various embodiments.

In contrast to the seed lamination 212 coupling provided by having a non-magnetic layer between the magnetic layers 218 and 220, as shown in FIG. 3, the exchange coupling corresponding with direct physical contact of each magnetic layer 218 and 220 and the bottom shield 222 allows for diverse magnetic operation capable of being optimized for a variety of data storage environments. While contacting a magnetic layer with the bottom shield can correspond with exchange coupling, such coupling may not be appropriate in some magnetic elements. FIG. 5 provides a portion of an example magnetic element 250 that has a seed lamination 252 tuned to provide interlayer coupling in a coupled portion 254 of the magnetic element 250.

As shown, the coupled portion 254 has a first non-magnetic layer 256 disposed between a bottom shield 258 and a first magnetic layer 260. A second non-magnetic layer 262 provides antiferromagnetic coupling between the first magnetic layer 260 and a second magnetic layer 264 that can be tuned through configuration of the magnetic 260 and 264 and non-magnetic 256 and 262 layers to similar or dissimilar thicknesses and materials. As a non-limiting example, the first non-magnetic layer 256 can be formed of a 0.3 to 2 nm thick film of Ta, Ru, Hf, or Pt, the first 260 and second 264 magnetic layers are each greater than 2 nm thick films of NiFe or bilayer NiFe/CoFe, and the second non-magnetic layer 262 is constructed as a 0 to 1 nm thick film of Ru.

Meanwhile, a decoupled portion 266 of the magnetic element 250 can be configured to have a third non-magnetic layer 268 that magnetically separates an AFM 270 of a magnetic stack from the coupled portion 254. The decoupling of the AFM 270 from the first 260 and second 264 magnetic layers of the seed lamination 252 allows the AFM 270 and magnetic stack to free of errant magnetizations that can degrade magnetoresistive operation. With respect to the exchange coupling provided by the magnetic layers of FIGS. 3 and 4 contacting the respective bottom shields, the interlayer coupling provided by the first non-magnetic layer 256 allows the seed lamination 252 to absorb magnetic fields in a different way, which may correspond with magnetic element operation conducive to some data storage environments more than the seed laminations illustrated in FIGS. 3 and 4.

Figure 6:
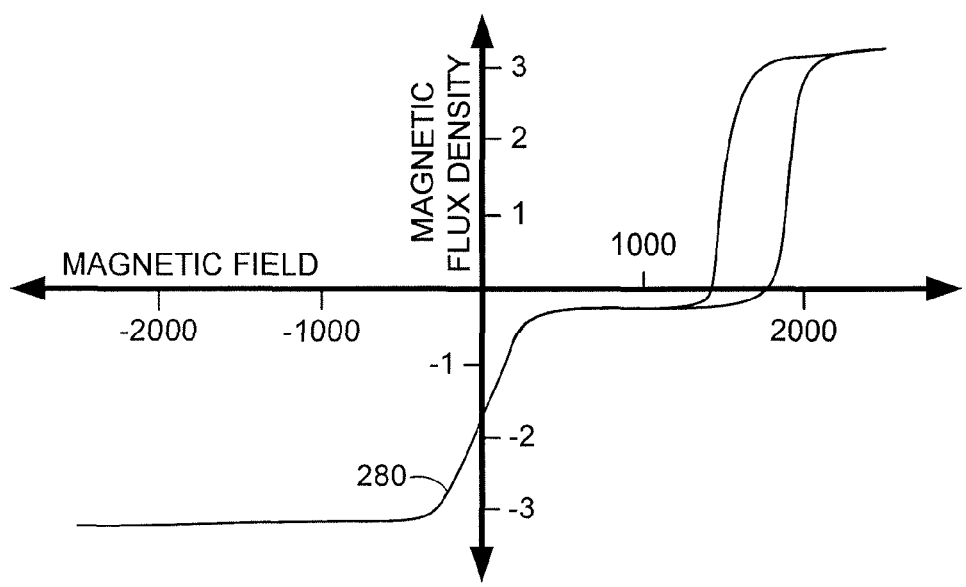
FIG. 6 plots operational data from an example magnetic element operated in accordance with some embodiments.

FIG. 6 plots a flux density versus magnetic field (BH) loop 280 when magnetization is applied perpendicular of the ABS of a tuned magnetic element. Loop 280 illustrates how configuring a magnetic element with a seed lamination comprising both coupled and decoupled portions increases the linearity of magnetic field response for the tuned seed lamination in a manner similar to the bottom shield and magnetically free layer. The variety of coupling configurations shown in FIGS. 3-5 along with the ability to tune the material and thicknesses of the respective seed lamination layers can alter loop 280 to respond in different ways to encountered magnetic fields to increase magnetic stability, such as by optimizing exchange bias fields in the magnetic stack to reduce magnetic domain movement.

Figure 7:
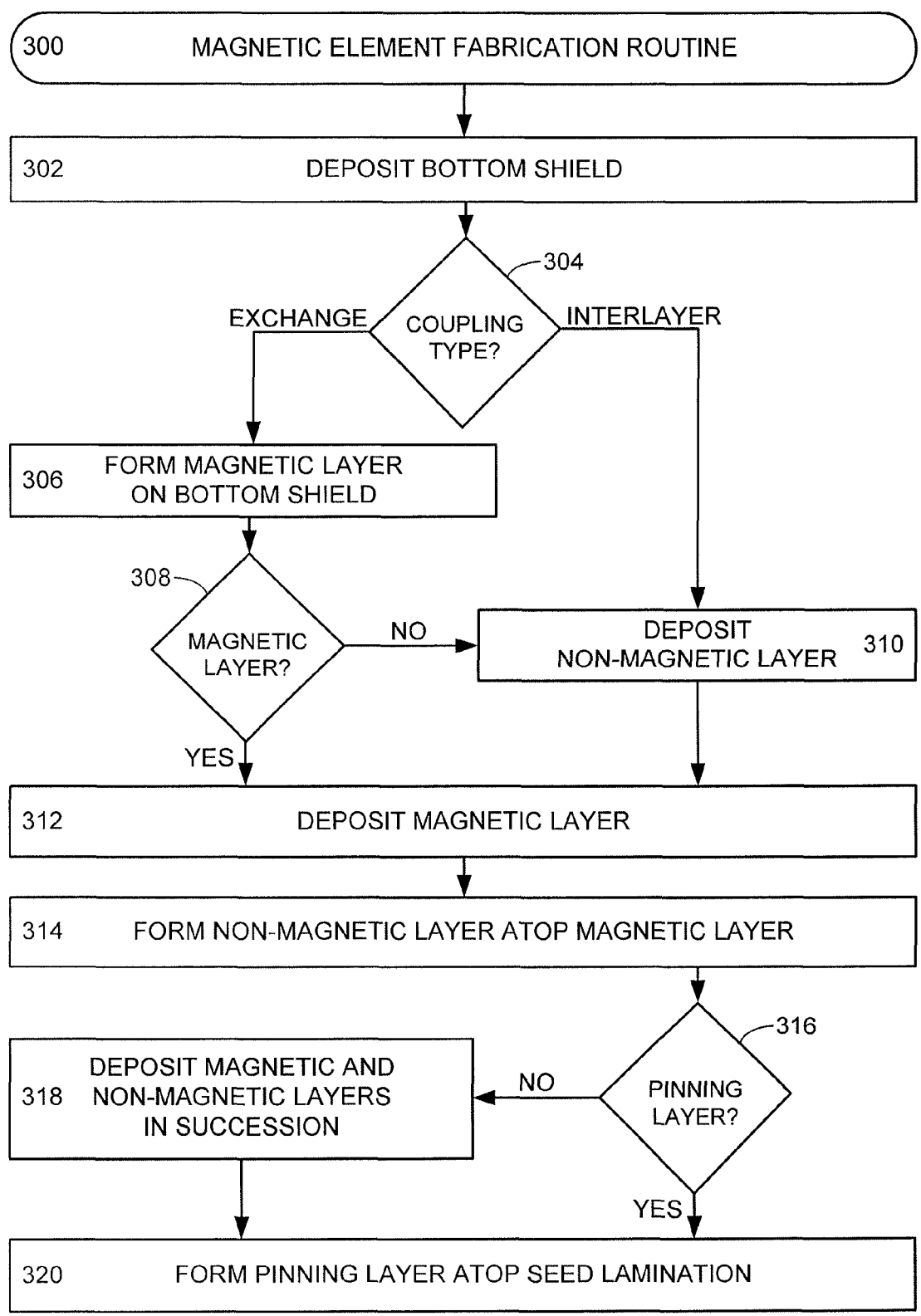
FIG. 7 provides a flowchart of an exemplary magnetic element fabrication routine carried out in accordance with various embodiments

The ability to tune the various layers of a seed lamination allows for catered optimization of the magnetic absorption, magnetic extent, and physical size of the magnetic element. Such tuning can occur at any time and may adhere to a predetermined fabrication routine. FIG. 7 provides just such a magnetic element fabrication routine 300 conducted in accordance with various embodiments. While not required or limiting, the routine 300 can begin with the deposition of a bottom shield in step 302. Such bottom shield may be configured as a single layer or a lamination of layers of soft magnetic material such as NiFe.

Construction of the bottom shield can be concurrently of sequentially conducted with decision 304 where the type of coupling between the bottom shield and the seed lamination is to be determined. A decision for exchange coupling leads routine 300 to step 306 in which a magnetic layer of a predetermined thickness, such as 2 nm or less, and material, such as CoFeB, is formed in direct contact with the bottom shield. Decision 308 immediately follows the formation of the magnetic layer in step 306 by evaluating whether another magnetic layer is to be constructed. Whether decision 308 chooses to no have a magnetic layer atop the existing magnetic layer or decision 304 determines interlayer coupling between the bottom shield and seed lamination is desired, step 310 deposits a non-magnetic layer of predetermined thickness, such as less than 2 nm, and material, such as Ta.

However, if decision 308 chooses to implement a magnetic layer, step 312 proceeds to deposit the magnetic layer with a thickness and material that may be similar or dissimilar than the magnetic layer formed in step 306. For example, the magnetic layer constructed in step 312 may be NiFe or an NiFe alloy while the magnetic layer contacting the bottom shield comprises an amorphous CoFe alloy. A non-magnetic layer is subsequently formed in step 314 atop the magnetic layer to either provide a seed lamination with alternating magnetic and non-magnetic layers, as shown in FIGS. 3 & 5, or with two magnetic layers in direct contact, as displayed in FIG. 4.

Next, decision 316 evaluates whether the seed lamination is completed and a pinning layer corresponding to the beginning of a magnetic stack is ready to be formed. A negative answer to decision 316 results in the deposition of additional magnetic and non-magnetic layers in succession so that a five layered seed lamination is interlayer coupled to the bottom shield. A positive answer to decision 316 or the conclusion of step 318 finally forms a pinning layer, such as an AFM, atop the seed lamination in step 320.

Through the various steps and decisions of routine 300, a magnetic element can be created with an optimized seed structure that is tuned to concurrently provide coupled and decoupled portions. However, routine 300 is not limited to the steps and decisions provided in FIG. 7 as an unlimited variety of steps and processes may be changed, omitted, and added, at will. As a non-limiting example, at least one decision could be added to evaluate the texture of the various magnetic and non-magnetic layers of the seed lamination, which can provide predetermined grain growth and magnetic properties of the pinning layer formed in step 320.

The diverse magnetic element configurations and plethora of tuning options provided through construction of a magnetic seed lamination allows for precisely optimized structure and magnetic operation. The ability to couple portions of the seed lamination to the bottom shield to both decrease the shield-to-shield spacing of the magnetic element allows for heightened data resolution and reliable magnetic operation. Additionally, the decoupling of other portion of the seed lamination from the bottom shield increases magnetic stability of the magnetic element, which allows the magnetic element to more rapidly and accurately sense data bits, especially data bits in reduced form factor data storage devices.

While the embodiments herein have been directed to magnetic sensing, it will be appreciated that the claimed invention can readily be utilized in any number of other applications, including data storage device applications. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetic seed lamination disposed between a data reader stack and a magnetic shield, the magnetic seed lamination comprising a first non-magnetic layer disposed between first and second magnetic layers and a second non-magnetic layer disposed between the reader stack and the second magnetic layer, the first magnetic layer contacting the magnetic shield and having a first uniaxial anisotropy that differs from a second uniaxial anisotropy of the second magnetic layer.

2. The apparatus of claim 1, wherein the data reader stack comprises an abutted junction lamination with a fixed magnetization providing pinning layer.

3. The apparatus of claim 1, wherein the data reader stack comprises a trilayer lamination without a fixed magnetization providing layer.

4. The apparatus of claim 1, wherein the first and second magnetic layers are coupled to the magnetic shield.

5. The apparatus of claim 1, wherein the first magnetic layer comprises one of the group of NiFe, NiFeCr, NiFeMo, NiFeW, CoNiFe, and CoFeB.

6. The apparatus of claim 1, wherein the second non-magnetic layer contacts an antiferromagnetic layer of the reader stack.

7. The apparatus of claim 1, wherein the second magnetic layer comprises NiFeW.

8. The apparatus of claim 1, wherein the second non-magnetic layer comprises one of the group of Ta, Pt, Pd, Cr, Mo, Cu, Ag, and Au to block diffusion of material into the first and second magnetic layers.

9. The apparatus of claim 1, wherein the first and second magnetic layers have different coupling strengths.

10. The apparatus of claim 1, wherein the data reader stack has a magnetically free layer opposite a barrier layer from a magnetically fixed pinning layer, the pinning layer contacting the second non-magnetic layer.

11. An apparatus comprising a magnetic seed lamination disposed between a data reader stack and a magnetic shield, the magnetic seed lamination comprising a first non-magnetic layer disposed between first and second magnetic layers and a second non-magnetic layer disposed between the reader stack and the second magnetic layer, the first magnetic layer contacting the magnetic shield and having a first uniaxial anisotropy and first magnetic moment that respectively differ from a second uniaxial anisotropy and second magnetic moment of the second magnetic layer.

12. The apparatus of claim 11, wherein the seed lamination has a uniform width, the uniform width measured perpendicular to a shield-to-shield spacing of the reader stack.

13. The apparatus of claim 11, wherein the second non-magnetic layer decouples the reader stack from the second magnetic layer.

14. The apparatus of claim 11, wherein the first magnetic layer is exchange coupled to the magnetic shield.

15. The apparatus of claim 11, wherein the first magnetic layer has a first thickness, the second magnetic layer has a second thickness, the first non-magnetic layer has a third thickness, and the second non-magnetic layer has a fourth thickness, each thickness measured parallel to a shield-to-shield spacing of the reader stack, the fourth thickness being different than the first, second, and third thicknesses.

16. The apparatus of claim 11, wherein the first magnetic layer comprises a first material that differs from a second material of the second magnetic layer.

17. The apparatus of claim 11, wherein at least one of the first and second magnetic layers comprises a bilayer of CoFe and NiFe.

18. A magnetic element comprising a magnetic seed lamination disposed between a data reader stack and a magnetic shield, the magnetic seed lamination comprising a first non-magnetic layer disposed between first and second magnetic layers and a second non-magnetic layer disposed between the reader stack and the second magnetic layer, the first magnetic layer contacting the magnetic shield and having a first uniaxial anisotropy that differs from a second uniaxial anisotropy of the second magnetic layer, the second non-magnetic layer contributing to a shield-to-shield spacing of the reader stack, the first magnetic, second magnetic, and first non-magnetic layers each being omitted from the shield-to-shield spacing.

19. The magnetic element of claim 18, wherein the first and second magnetic layers are configured to absorb at least one magnetic field of the magnetic shield.

20. The magnetic element of claim 18, wherein the first and second magnetic layers are collectively configured to reduce magnetic domain movement in the data reader stack.

* * * * *